United States Patent

[11] 3,613,023

[72] Inventors Carl R. Barrett, Jr.;
Ernest R. Roehl, both of Anaheim, Calif.
[21] Appl. No. 816,700
[22] Filed Apr. 16, 1969
[45] Patented Oct. 12, 1971
[73] Assignee The United States of America as represented by the Secretary of the Air Force

[54] STEP FUNCTION STC GAIN FUNCTION UTILIZING TUNNEL DIODE AMPLIFIER CIRCUITS
2 Claims, 2 Drawing Figs.

[52] U.S. Cl. .......... 330/61 A, 307/286, 307/322, 330/40
[51] Int. Cl. .......... H03f 21/00
[50] Field of Search .......... 330/61 A; 307/286, 322

[56] References Cited
UNITED STATES PATENTS

| | | | |
|---|---|---|---|
| 3,193,703 | 7/1965 | Crouse | 307/286 X |
| 3,321,640 | 5/1967 | Amodei | 307/286 |
| 3,334,336 | 8/1967 | Koether et al. | 307/286 X |

*Primary Examiner*—Nathan Kaufman
*Attorneys*—Harry A. Herbert, Jr. and George Fine

ABSTRACT: A radar receiver gain control apparatus utilizing tunnel diode amplifier circuits to provide a step-sensitivity time-control gain function to control the gain of the receiver.

INVENTORS.
CARL R. BARRETT JR.
ERNEST R. ROEHL
BY Harry A. Herbert Jr. and
George Fine
ATTORNEYS

STEP FUNCTION STC GAIN FUNCTION UTILIZING TUNNEL DIODE AMPLIFIER CIRCUITS

BACKGROUND OF THE INVENTION

The receivers which are to operate over a wide range of dynamic input levels require some form of receiver gain control. There are several prior art techniques which may be used to perform this function. However, in the type of receiver which is used in radar systems there are two techniques which find almost universal application. These techniques are automatic gain control (AGC) and sensitivity time control (STC).

The first of these prior art techniques, the automatic gain control, operates in response to the amplitude of the received signal to normalize the receiver output to some preset function of the signal input. The second of these, sensitivity time control, operates to very the gain of the receiver according to some predetermined function of time. Basically, this means that the receiver gain is controlled in such a manner as to normalize the expected signal return to a preselected function of time.

The prior art utilized a conventional microwave receiver with the STC applied to first IF amplifier. In this case, the STC characteristic is applied to the first stage of IF amplification. In order to improve the noise figure of the receiver and hence the ultimate sensitivity of the receiver, radio frequency amplification is introduced prior to the mixer. An amplifier currently suitable for application in an RF amplification configuration is the tunnel diode amplifier.

One particular method used for STC with tunnel diode amplifier is to introduce in the RF circuit, just before the tunnel diode amplifier, a voltage-controlled diode attenuator. This process offers the major disadvantages of an insertion loss prior to the RF amplifier and a very difficult problem of gain and phase-tracking parallel receiver channels. The problem of additional loss, prior to the RF amplifier increases the resultant noise figure of the receiver and thus offsets much of the desired performance improvement gained by RF amplification.

Another prior art technique which is considered for STC of tunnel diode amplifiers is to control the bias level on the diode.

If the bias of the diode is controlled in such a manner as to provide a continuous gain versus time characteristic, problems continue to exist. For example, in systems such as parallel RF channels which require simultaneous gain and phase tracking, this technique becomes quite unpredictable.

SUMMARY OF THE INVENTION

The present invention utilizes a tunnel diode arranged in an amplifier configuration to provide a step STC gain function in a radar receiver gain control apparatus. The tunnel diode amplifier circuit is biased to switch between an amplifier with a low-noise figure and an attenuator with a wide linear dynamic range.

It is one object of the invention, therefore, to provide an improved radar receiver gain control apparatus having a step STC gain function by utilizing tunnel diode amplifier circuits.

It is another object of the invention to provide an improved radar receiver gain control apparatus utilizing the low-noise figure characteristics of tunnel diodes.

It is another object of the invention to provide an improved radar receiver gain control apparatus extending the linear dynamic range of the receiver.

It is still another object of the invention to provide an improved gain control apparatus having a greatly simplified means of RF gain control in the gain and phase tracking of parallel RF channels in the receiver.

It is yet another object of the invention to provide an improved gain control apparatus having the capability of handling high power signal levels without diode failures.

DESCRIPTION OF THE DRAWINGS

These and other advantages, features and objects of the invention will become more apparent from the following description taken in connection with the illustrative embodiments in the accompanying drawings, wherein.

DESCRIPTION OF THE PREFERRED EMBODIMENT

Figure 1:
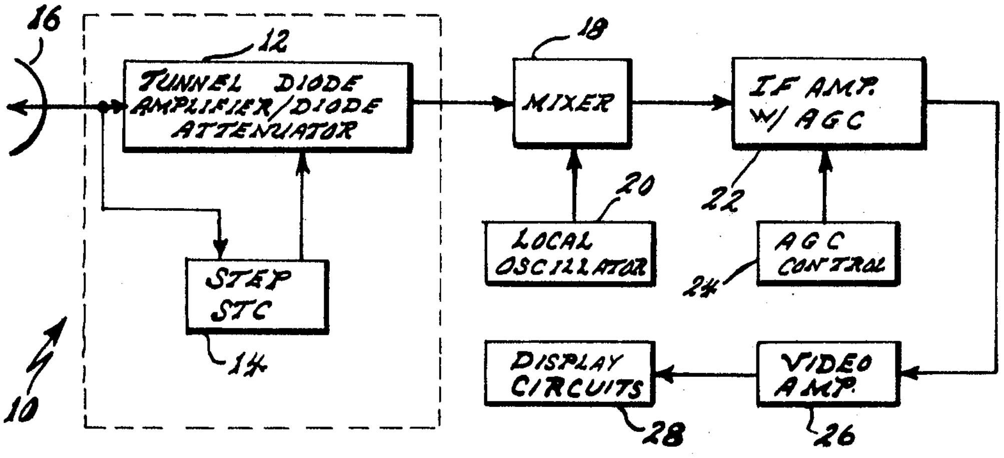
FIG. 1 is a block diagram of a radar receiver utilizing the step function STC gain unit in accordance with this invention.
Figure 2:
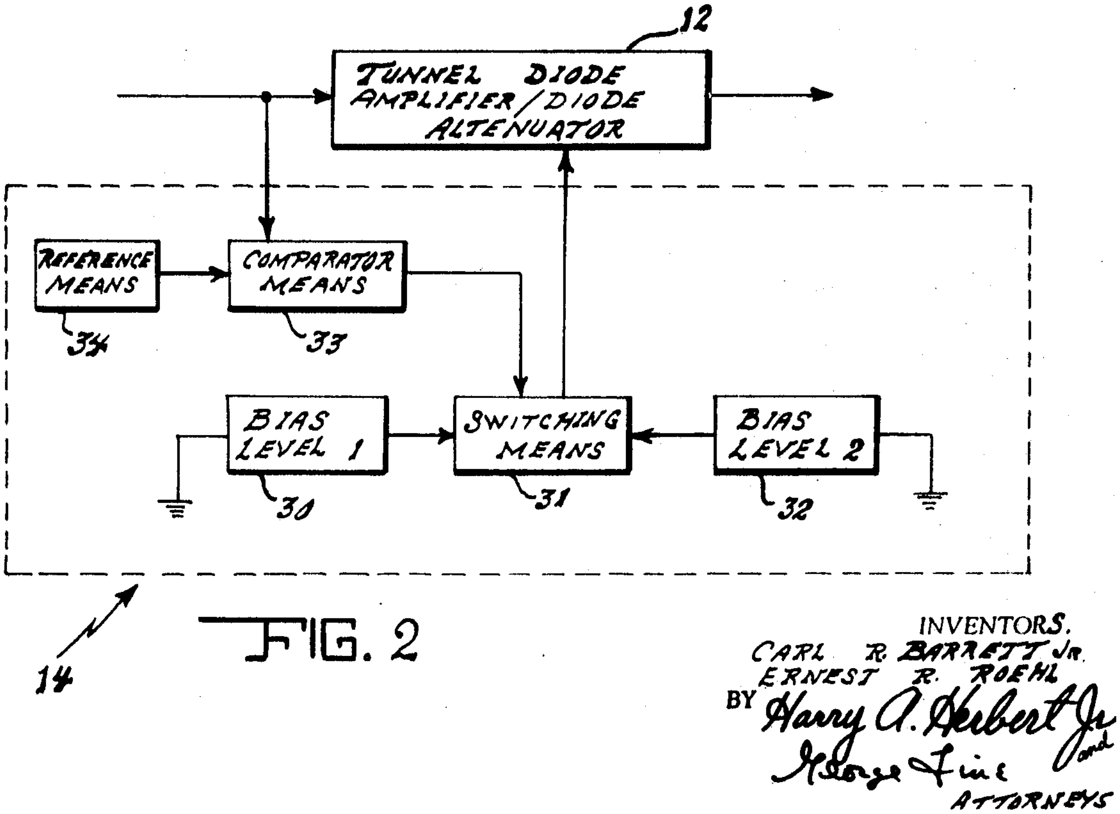
FIG. 2 is a detailed block diagram of the step function STC gain unit.

Referring now to FIG. 1, there is shown a conventional radar receiver utilizing the step function STC gain unit 10 which is comprised of a tunnel diode amplifier/diode attenuator 12 and a step STC unit 14. Return radar signals are received at antenna 16 and are coupled to tunnel diode amplifier/diode attenuator 12. The output of tunnel diode amplifier/diode 12 is coupled to mixer 18 which also receives an input signal from local oscillator 20. An AGC loop which is contained within IF amplifier 22 receives a gain control signal from AGC control unit 24. The output of IF amplifier 22 is applied to video amplifier 26 which provides display information to display circuits 28. The operation of the step function STC gain unit 10 will be better understood by referring to FIG. 2.

The step STC unit 14 is comprised of a bias unit 30, a level switching unit 31, a bias unit 32, a conventional signal comparator means 33 and a reference means 34. A portion of the received signal which is applied to tunnel diode amplifier/diode attenuator 12 is fed to signal comparator means 33. Reference means 34 provides a reference signal to signal comparator means 33 for establishing the level of signal applied to the input of the tunnel diode amplifier/diode attenuator 12. Once the level of signal has been compared against the reference signal from reference means 34, the signal comparator means 33 provides a control signal to switching means 31. The switching means 31 which is responsive to the control signal from comparator means 33 applies either bias level 1 or bias level 2 to tunnel diode amplifier/diode attenuator 12. A bias level number 1 which is provided by bias unit 30 is substantially positive with respect to bias level 2 which is provided by bias unit 32. Switching unit 31 is a conventional switch device and provides either bias level 1 or 2 to tunnel diode amplifier/diode attenuator 12. Tunnel diode amplifier/diode attenuator 12 operates as either a tunnel diode amplifier if bias level 1 is applied to it or as a diode attenuator if bias level 2 is applied.

Tunnel diodes have a voltage current relationship curve which includes a region of negative dynamic impedance. Thus, by biasing the diode in this negative dynamic impedance region and with the appropriate circuitry, the tunnel diode may be made to amplify. Now, if the diode bias level is moved about in this negative impedance region, the gain of the device will change as some function of this bias level. Measurements have been performed which indicate that tunnel diode amplifiers at X-Band may display a variable gain of 8 to 16 db. with approximately 6 to 8 db. insertion loss for increasing bias level change. When the tunnel diode is biased away from the negative dynamic impedance region, the tunnel diode amplifier becomes an attenuator with linear dynamic ranges and its burnout ratings approach those of conventional mixer diodes. Therefore, the lossy RF devices, which are required for linear RF dynamic ranges but reduce the effectiveness of the low-noise figure tunnel diode amplifiers, are eliminated.

The step STC gain function is provided by using the tunnel diode amplifier/diode attenuator 12 as a two state device. This is achieved by providing either one of two bias levels Nos. 1 and 2, which alternatively switch the tunnel diode circuit between an amplifier with a low noise figure and an attenuator with wide linear dynamic limits. Therefore, it may be noted that the low noise figure characteristics of the tunnel diode amplifier may be utilized to maximum advantage when the input signals range from noise level up to −45 dbm. The linear dynamic range of the receiver is greatly enhanced and the problem of gain and phase tracking inherent in parallel RF channels in the receiver is greatly simplified over other means of RF gain control. The tunnel diode amplifier/diode attenuator 12, when biased in the lossy position, is capable of handling large signal power levels without danger of diode burnout.

Tests have been performed on several mid Ku band tunnel diode amplifiers to determine the optimum bias setting for using the device as an attenuator. The required characteristics are:

1. The attenuation must be constant for input signal power levels from −45 dbm up to the highest received input signal level of the system (usually about −10 dbm).

2. The attenuation should be constant to within about 0.5 db. throughout the required microwave frequency range of the system.

The tunnel diode bias level position which satisfies this requirement is the point at which the diode resistance remains constant for the largest change in input power levels. The following three separate bias points, (1) the valley region of the I–V characteristic, (2) zero bias (all voltage removed), and (3) a slightly negative bias of about −50 millivolts, provided the following characteristics. The valley region provides the highest attenuation, about 15 to 18 db. However, the dynamic range is somewhat limited. The attenuation starts becoming larger at about −20 to −25 dbm. The zero bias region provides a constant attenuation for a wide dynamic range of input power levels. The attenuation, remains constant to within 0.5 db. for input power levels up to −10 dbm. or higher. The attenuation is in the range of about 6 to 8 db for this case. The negative voltage bias of about 60 millivolts extends the dynamic range of the device about 5 db. The attenuation is constant to within 0.5 db. for input power levels up to −5 dbm. The attenuation is in the range of 5 to 7 db. for this case.

The attenuation as a function of microwave frequency is constant to within 0.5 db. throughout at least 400 megacycles for the zero bias and 50 millivolts negative bias positions. The attenuation varies by 3 db. or more throughout a 400 megacycle range when the diode is switched into the valley region. The two-state tunnel diode step function STC gain unit is superior to other mechanizations. The unit is operated as an amplifier for input signals from the noise level up to −45 dbm. The diode bias is then removed or a slightly negative voltage is applied for power input signal levels from −45 dbm. up to the highest received signal levels, which are usually about −10 dbm. to −5 dbm.

Although the invention has been described with reference to a particular embodiment, it will be understood to those skilled in the art that the invention is capable of a variety of alternative embodiments within the spirit and scope of the appended claims.

I claim:

1. In a radar receiver a step function sensitivity time control apparatus comprising in combination, a tunnel diode amplifier circuit having a first and second bias state, said tunnel diode amplifier receiving an input signal, a first bias means, a second bias means having a potential which is less positive than said first bias means, a switching means for applying either said first bias means or said second bias means to said tunnel diode amplifier said first bias means establishing said tunnel diode amplifier in said first bias state and said second bias means establishing said tunnel diode amplifier in said second bias state, said first bias state establishes a tunnel diode amplifier circuit configuration with a low-noise figure, said second bias state establishes a diode attenuator circuit configuration having wide dynamic limits, said first and second bias means thus providing a step sensitivity time control gain function to control the gain of said radar receiver, and; a comparator means connected to the input of said tunnel diode amplifier to receive said input signal, said comparator means being connected to a reference means to provide a reference standard, said comparator means comparing said input signal to said reference standard; said comparator means providing a control signal to said switching means in accordance with the relationship between said input signal and said reference standard, said switching means applying either said first bias means or said second bias means to said tunnel diode amplifier in response to said control signal.

2. A step function sensitivity time control apparatus as described in claim 1 wherein said diode attenuator circuit provides a substantially constant attenuation within 0.5 db. for input power levels up to −10 dbm. or higher throughout the microwave frequency range of the receiver.